(12) United States Patent
Camp et al.

(10) Patent No.: US 7,008,123 B2
(45) Date of Patent: Mar. 7, 2006

(54) IMAGE FORMING DEVICE HAVING A BRUSH TYPE PROCESSING MEMBER

(75) Inventors: Alphonse D. Camp, Rochester, NY (US); Zhanjun Gao, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 32 days.

(21) Appl. No.: 10/722,248

(22) Filed: Nov. 25, 2003

(65) Prior Publication Data

US 2005/0110975 A1    May 26, 2005

(51) Int. Cl.
*G03D 9/02*   (2006.01)
*G03B 27/00*  (2006.01)

(52) U.S. Cl. ............... 396/583; 355/27; 355/400; 355/406; 430/138; 492/30

(58) Field of Classification Search ............... 355/400, 355/406, 27–29, 40; 396/583; 492/30; 430/138; 503/201
See application file for complete search history.

(56) References Cited

U.S. PATENT DOCUMENTS

| 4,448,516 A | 5/1984 | Arney et al. ............... 355/27 |
| 4,624,560 A | 11/1986 | Beery ...................... 355/406 |
| 4,772,530 A | 9/1988 | Gottschalk et al. ......... 430/138 |
| 4,772,541 A | 9/1988 | Gottschalk et al. ......... 430/138 |
| 4,800,149 A | 1/1989 | Gottschalk et al. ......... 430/138 |
| 4,824,755 A | 4/1989 | Feldman et al. ........... 396/564 |
| 4,842,980 A | 6/1989 | Gottschalk et al. ......... 430/138 |
| 4,865,942 A | 9/1989 | Gottschalk et al. ......... 430/138 |
| 5,032,566 A | 7/1991 | Higashiyama ............. 503/201 |
| 5,057,393 A | 10/1991 | Shanklin et al. ........... 430/138 |
| 5,100,755 A | 3/1992 | Shanklin .................. 430/138 |
| 5,783,353 A | 7/1998 | Camillus et al. ........... 430/138 |
| 5,884,114 A | 3/1999 | Iwasaki .................... 396/583 |
| 6,229,558 B1 | 5/2001 | Saigo et al. ............... 347/232 |
| 6,483,575 B1 | 11/2002 | Allen et al. ............... 355/400 |
| 2002/0045121 A1 | 4/2002 | Higuchi et al. ............ 430/138 |

FOREIGN PATENT DOCUMENTS

| EP | 0 372 927 | 6/1990 |
| EP | 1 168 076 | 1/2002 |
| EP | 1 429 182 | 6/2004 |

*Primary Examiner*—D. Rutledge
(74) *Attorney, Agent, or Firm*—David A. Novais

(57) ABSTRACT

The present invention relates to an image-forming device that comprises a roller that includes a plurality of micromembers. The micromembers are preferably hook or loop-like members made of a compliant material such as plastic or rubber. The micromembers on the roller essentially define a compliant surface, which is self-correcting for unintentional media thickness variations within a print area. The roller is rotational such that when the roller contacts the media the rotational or spinning force is converted to a compressional force, which is sufficient to rupture the microcapsules in the media.

14 Claims, 10 Drawing Sheets

IMAGE FORMING DEVICE HAVING A BRUSH TYPE PROCESSING MEMBER

CROSS REFERENCE TO RELATED APPLICATIONS

Reference is made to commonly-assigned U.S. patent application Ser. No. 10/687,939 filed Oct. 17, 2003, entitled IMAGING ELEMENT HAVING PROTECTIVE OVERCOAT LAYERS to Hwei-Ling Yau et. al.

FIELD OF THE INVENTION

The present invention relates to an image forming device for processing photosensitive media, wherein the photosensitive media includes a plurality of microcapsules that encapsulate imaging material such as coloring material.

BACKGROUND OF THE INVENTION

Image forming devices are known in which media having a layer of microcapsules containing a chromogenic material and a photohardenable or photosoftenable composition, and a developer, which may be in the same or a separate layer from the microcapsules, is image-wise exposed. In these devices, the microcapsules are ruptured, and an image is produced by the differential reaction of the chromogenic material and the developer. More specifically, in these image-forming devices, after exposure and rupture of the microcapsules, the ruptured microcapsules release a color-forming agent, whereupon the developer material reacts with the color-forming agent to form an image. The image formed can be viewed through a transparent support or a protective overcoat against a reflective white support as is taught in, for example, U.S. Pat. No. 5,783,353 and U.S. Publication No. 2002/0045121 A1. Typically, the microcapsules will include three sets of microcapsules sensitive respectively to red, green and blue light and containing cyan, magenta and yellow color formers, respectively, as taught in U.S. Pat. No. 4,772,541. Preferably a direct digital transmission imaging technique is employed using a modulated LED print head to expose the microcapsules.

Conventional arrangements for developing the image formed by exposure in these image-forming devices include using spring-loaded balls, micro wheels, micro rollers or rolling pins, and heat from a heat source is applied after this development step to accelerate development.

The photohardenable composition in at least one and possibly all three sets of microcapsules can be sensitized by a photo-initiator such as a cationic dye-borate complex as described in, for example, U.S. Pat. Nos. 4,772,541; 4,772,530; 4,800,149; 4,842,980; 4,865,942; 5,057,393; 5,100,755 and 5,783,353.

The above describes micro-encapsulation technology that combines micro-encapsulation with photo polymerization into a photographic coating to produce a continuous tone, digital imaging member. With regard to the media used in this technology, a substrate is coated with millions of light sensitive microcapsules, which contain either cyan, magenta or yellow image forming dyes (in leuco form). The media further comprises a monomer and the appropriate cyan, magenta or yellow photo initiator that absorb red, green or blue light respectively. Exposure to light, after the induction period is reached, induces polymerization.

When exposure is made, the photo-initiator absorbs light and initiates a polymerization reaction, converting the internal fluid (monomer) into polymer, which binds or traps leuco dye from escaping when pressure is applied.

With no exposure, microcapsules remain soft and are easily broken, permitting all of the contained dye to be expelled into a developer containing binder and developed which produces the maximum color available. With increasing exposure, an analog or continuous tone response occurs until the microcapsules are completely hardened, to thereby prevent any dye from escaping when pressure is applied.

Conventionally, as describe above, in order to develop the image, pressure is uniformly applied across the image. As a final fixing step, heat is applied to accelerate color development and to extract all un-reacted liquid from the microcapsules. This heating step also serves to assist in the development of available leuco dye for improved image stability. Generally, pressure ruptured capsules (unhardened) expel lueco dye into the developer matrix.

Approximately 100 mega Pascal or 14,500 psi normal pressure was required for capsule crushing as documented in prior art. This need for precise application of high pressure (high compressive forces) presented a limitation to the extensibility of the conventional imaging system. Small compact low cost printers typically employed micro-wheels or balls backed by springs and operate in a scanning stylus fashion by transversing the media. This allowed for low cost and relatively low spring force due to the small surface area that the ball or micro wheel (typically 2 to 3 mm diameter) contacted on the media. The disadvantage of this method was that the processing pitch required to ensure uniform development needs to be (approximately 1 mm for a 3/16" diameter ball) which results in slow processing times for a typical print image format (4×6 inch). Ganging multiple ball stylus or micro wheels adds cost, and increases the possibility of processing failure due to debris caught under a ball surface.

Conventional high speed processing involved line processing utilizing large crushing rollers. To ensure the high pressure, (psi) required, these rollers tended to be large to minimize deflection. However, these large rollers were costly, heavy, and require high spring loading. Again, the extensibility of this method is limited as larger rollers (and spring loads) are required as media size increases.

Recent developments in media design (or the imaging member) as described in co-pending U.S. application Ser. No. 10/687,939 have changed the prior art structure of the imaging member within the context of the present invention to the point where the aforementioned means of processing are no longer robust. The use of a substantially non-compressible top clear polymer film layer and a rigid opaque backing layer which serves to contain the image forming layer of conventional media presented a processing position whereby balls, micro wheels or rollers could be used without processing artifacts such as scratch, banding, or dimensional or surface deformation. In addition, the non-compressibility of this prior art structure provided more tolerance to processing conditions.

The recent imaging member embodiment as described in the above-mentioned co-pending patent application, replaces the top and bottom structures of the media with highly elastic and compressible materials (gel SOC) (super over coat or top most clear gel comprising layer) and synthetic paper (polyolefin). The media as described in the above-mentioned co-pending application no longer survive these means of processing in a robust fashion where pressure is applied by a roller or ball. This is due to the fact that in the imaging member described in the co-pending application, the polyolefin paper backing that is used as fiber base substrates (cellulose fiber) present non uniform density, and the high compression forces required for processing in the conventional arrangements may make an "image" of the fiber pattern in the print, thus making the print corrupt.

It would be advantageous to provide a means or method of processing that did not invoke present methods utilizing high compression forces to provide a high quality image by improving the tonal scale development and density minimum formation of the imaging member. As mentioned, the need to provide a means of processing that will facilitate the use of the recently designed imaging member is needed. In addition, a processing means that would use plain paper as a substrate would be highly desired. Further, it would be advantageous to provide a means of processing that is low in cost, is fully extensible, and is mechanically simple and robust.

There is also a need for a processing arrangement that can compensate for unintentional thickness variations in media by being "self correcting" and being able to successfully process imaging members (media) that comprises low cost substrates including paper fiber supports.

SUMMARY OF THE INVENTION

The present invention addresses the above noted drawbacks by providing for an imaging device, which comprises a roller that includes a plurality of micro-members thereon. The micro-members provide for a compliant surface, which can be non-uniform, is self-correcting for unintentional media thickness variations within a print area, and employs shear-like forces more so than compression forces or a combination thereof for development. The use of the micro-members restricts the processing development to the image-forming layer of the media, leaving both the top-most clear gel comprising layer intact and without scratches. Further, the roller of the present invention having the micro-members does not invade the bottom-most backing layer of the media and thus avoids pattern read out of low cost supports. The roller having micro members in accordance with the present invention essentially resembles a brush and thus can be referred to as a brush roller.

The image-forming device of the present invention including the brush roller is fully extensible for all printer applications and is low cost. The composition of the micro members or brushes of the brush roller of the present invention can be varied; for example, where a polymer can be used since it provides a soft contact surface, elasticity, and resiliency, however, any natural or synthetic material meeting these criteria can be employed as the micro-members or brush.

The present invention therefore relates to an image forming device which comprises an imaging member adapted to expose a photosensitive medium to form a latent image on the photosensitive medium, with the photosensitive medium comprising a plurality of microcapsules which encapsulate imaging material; and a rotatable processing member adapted to develop the latent image, with the processing member comprising a compliant surface that includes micro-members which contact the photosensitive medium during a rotation of the processing member to apply a force to a surface of the photosensitive medium, with the force being sufficient to release imaging material from the microcapsules.

The present invention also relates to an image forming method which comprises exposing a photosensitive medium which comprises a plurality of microcapsules which encapsulate imaging material to form a latent image; and developing the latent image by contacting a surface of the medium with a spinning processing member having a compliant surface formed by micro-members. The contacting of the spinning micro-members with the surface of the medium applying a force to the surface of the medium which is sufficient to release imaging material from the microcapsules.

DETAILED DESCRIPTION OF THE INVENTION

Figure 1A:
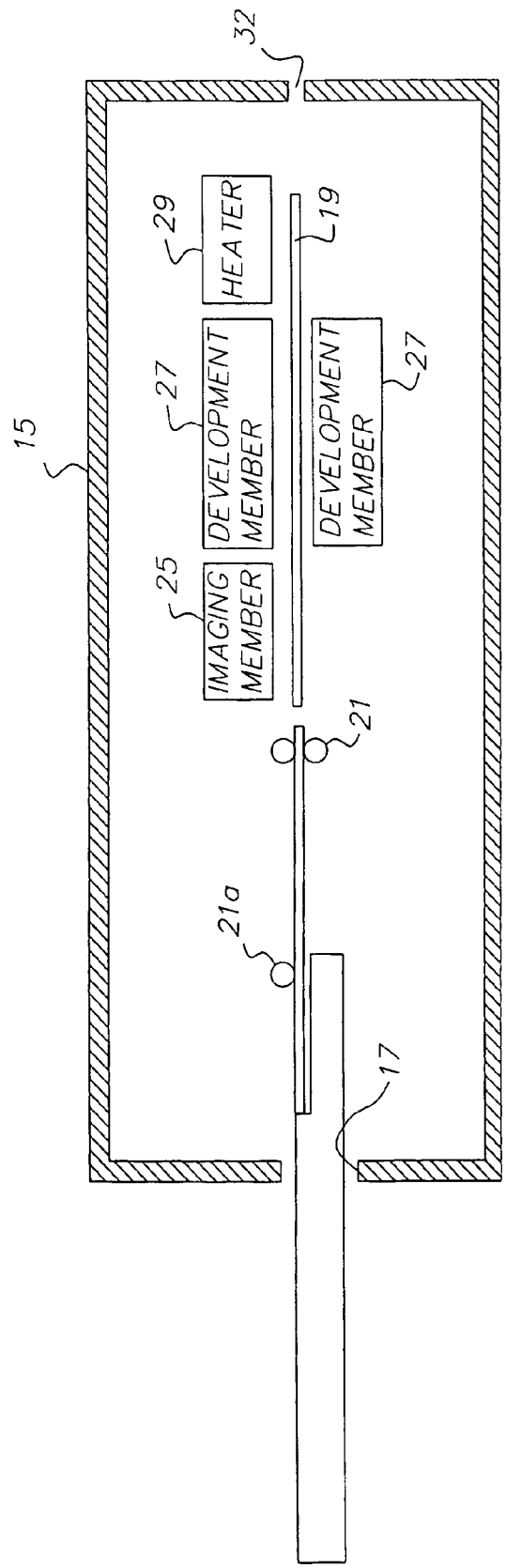
FIG. 1A schematically shows an image-forming device.

Referring now to the drawings, wherein like reference numerals represent identical or corresponding parts throughout the several views, FIG. 1A is a schematic view of an image-forming device 15 pertinent to the present invention. Image forming device 15 could be, for example, a printer that includes an opening 17 which is adapted to receive a cartridge containing photosensitive media. As described in U.S. Pat. No. 5,884,114, the cartridge could be a light tight cartridge in which photosensitive sheets are piled one on top of each other. When inserted into image forming device 15, a feed mechanism which includes, for example, a feed roller 21a in image forming device 15, working in combination with a mechanism in the cartridge, cooperate with each other to pull one sheet at a time from the cartridge into image forming device 15 in a known manner. Although a cartridge type arrangement is shown, the present invention is not limited thereto. It is recognized that other methods of introducing media into to the image-forming device such as, for example, individual media feed or roll feed are applicable to the present invention.

Once inside image forming device 15, photosensitive media travels along media path 19, and is transported by, for example, drive rollers 21 connected to, for example, a driving mechanism such as a motor. The photosensitive media will pass by an imaging member 25 in the form of an imaging head which could include a plurality of light emitting elements (LEDs) that are effective to expose a latent image on the photosensitive media based on image information. After the latent image is formed, the photosensitive media is conveyed past a processing assembly or a development member 27. Processing assembly 27 could be a pressure applicator or pressure assembly, wherein an image such as a color image is formed based on the image information by applying pressure to microcapsules having imaging material encapsulated therein to crush the microcapsules. The pressure could be applied by way of spring-loaded balls, micro wheels, micro rollers, rolling pins, etc.

Figure 1B:
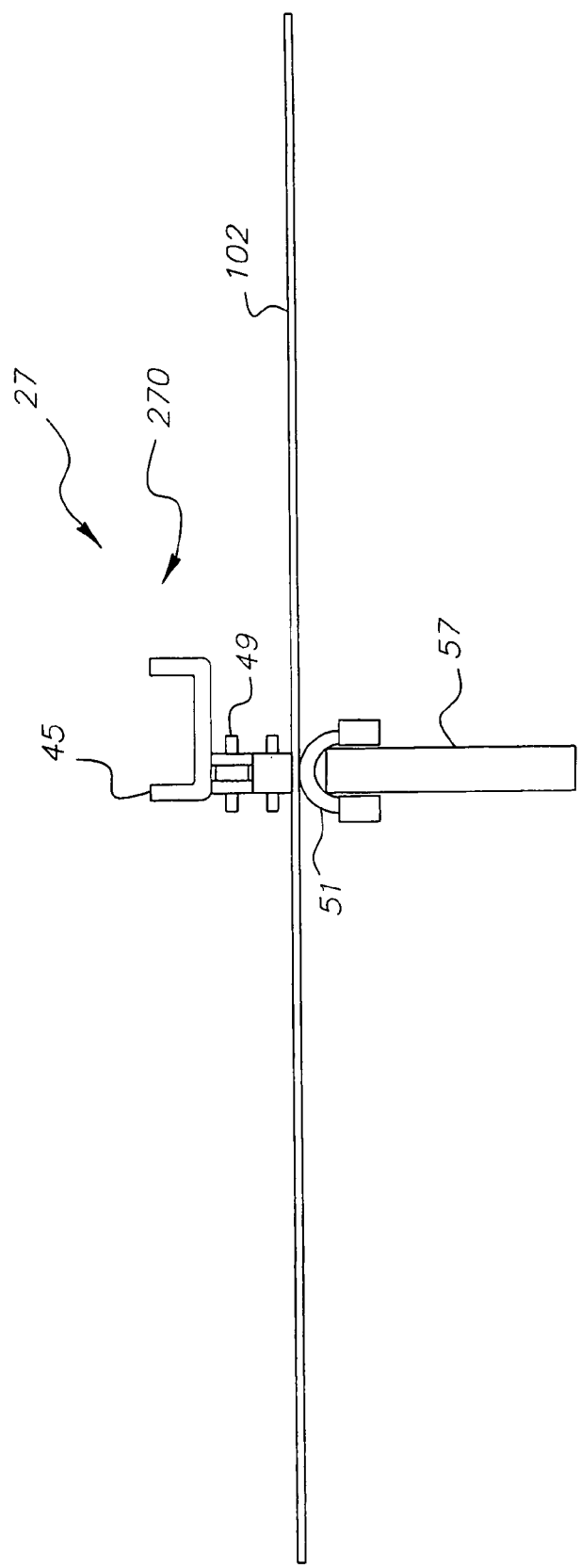
FIG. 1B schematically shows an example of a pressure applying system that can be used in the image-forming device of FIG. 1.

FIG. 1B schematically illustrates an example of a pressure applicator 270 for processing assembly 27 which can be used in the image-forming device of FIG. 1A. In the example of FIG. 1B, pressure applicator 270 is a crushing roller arrangement that provides a point contact on photosensitive medium 102. More specifically, pressure applicator 270 includes a support 45 that extends along a width-wise direction of photosensitive medium 102. Moveably mounted on support 45 is a crushing roller arrangement 49 that is adapted to move along the length of support 45, i.e., across the width of photosensitive medium 102. Crushing roller arrangement 49 is adapted to contact one side of photosensitive medium 102. A beam or roller type member 51 is positioned on an opposite side of photosensitive medium 102 and can be provided on a support or spring member 57. Beam or roller type member 51 is positioned so as to contact the opposite side of photosensitive medium 102 and is located opposite crushing roller arrangement 49. Beam or roller type member 51 and crushing roller arrangement 49 when in contact with photosensitive medium 102 on opposite sides provide a point contact on photosensitive medium 102. Crushing roller arrangement 49 is adapted to move along a width-wise direction of photosensitive material 102 so as to crush microcapsules and release coloring material. Further examples of pressure applicators or crushing members which can be used in the image-forming device of FIG. 1A are described in U.S. Pat. Nos. 6,483,575 and 6,229,558.

Within the context of the present invention, the imaging material comprises a coloring material (which is used to form images) or material for black and white media. After the formation of the image, the photosensitive media is conveyed past heater 29 (FIG. 1A) for fixing the image on the media. In a through-feed unit, the photosensitive media could thereafter be withdrawn through an exit 32. As a further option, image-forming device 15 can be a return unit in which the photosensitive media is conveyed or returned back to opening 17.

As previously discussed, conventional arrangements employ spring loaded micro-wheels or ball processing (point processing) to provide a pressure or crushing force to microcapsules of microencapsulated media. The traditional approach for crushing the microcapsules by way of a crushing force applied by balls, wheels or micro-rollers may provide for processing speeds which are in some instances not as fast as desired due to the fact that the development pitch of these arrangements are small, and processing velocity is limited to reasonable by-directional travel rates. Furthermore, in the traditional ball-crushing arrangements, debris introduced into the printer can cause the ball or microwheel to drag the debris over the media to cause a scratching of the image and, thus, render the print unusable.

In order to provide for a higher throughput device, large rollers, which have a width that covers the width of the media, can be utilized. However, these large rollers tend to have a non-compliant surface and will not compensate for imperfections or undulations in the media and, thus, results in poor processing. Further, if debris is carried by the large rollers, poor processing is also achieved.

Also, as discussed above, media substrates prone to deformation under the pressure load for development (typically 100 MpA) can jam in the device or irreversibly deform thus rendering the print unusable. In addition, debris entering the processing nip between rollers can cause damage to the roller rendering the processing means unusable.

Figure 2:
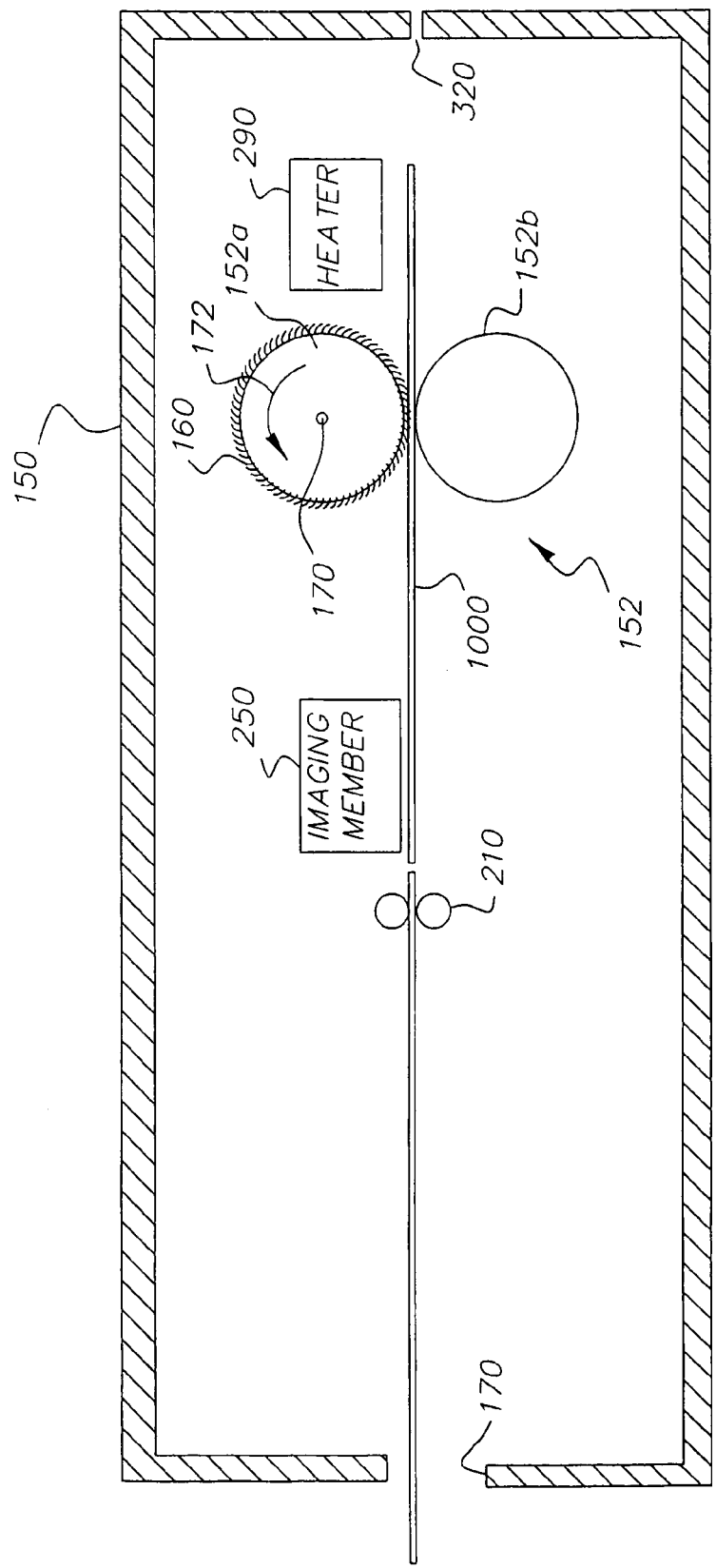
FIG. 2 schematically shows an image-forming device in accordance with the present invention.

The present invention overcomes the above-noted drawbacks by providing for an image-forming device 150 as shown in FIG. 2. Image-forming device 150 is similar to image-forming device 15 in FIG. 1 except for the processing member. More specifically, image-forming device 150 can be adapted to accept microencapsulated media through an opening 170, while a roller 210 can be adapted to convey the media to an imaging member 250. Imaging member 250 can be an imaging head that includes a plurality of light-emitting elements adapted to expose a latent image on the media based on image information. After the latent image is formed, the media is conveyed passed a processing assembly or a development member 152 in accordance with the present invention. Development member 152 comprises a roller 152a and a backing member 152b, which can be an opposing roller, an opposing beam or a surface having a width which generally matches the width of the media. Roller 152a includes a compliant outer surface, which is adapted to contact microencapsulated photosensitive medium 1000 when it travels between roller 152a and backing member 152b. More specifically, roller 152a includes a surface which comprises a plurality of micro-members 160. In a preferred embodiment, micro-members 160 are hook-like or loop-like members provided on the exterior surface of roller 152a. Hook or loop-like members 160 define an outer surface of roller 152a which is compliant and can be non-uniform. With this arrangement, roller 152a essentially resembles a brush and can also be referred to as a brush roller.

For processing media, roller 152a is rotated or spins about a center axis 170 in direction 172, such that micro-members 160, for example, the hooks or loop-like members, contact media 1000 with a rotational or spinning force so as to apply a shear-like force and/or a compressional force onto the top surface of media 1000. With this arrangement, the rotational force applied by micro-members 160 is essentially converted to a compressive or pressure force onto media 1000, which is sufficient to rupture the microcapsules. More specifically, micro-members 160 can be in the form of, for example, plastic loop or hook-like members that are randomly or predeterminedly provided on the outer surface of roller 152a and have random or predetermined heights and locations. The loop or hook-like members 160 provide sufficient force to rupture the capsules. Further, a random positioning in height of hook or loop-like members 160 allow for uniform development of non-uniform media thickness as the plurality of hook or loop-like members 160 impinge on the media and become self-correcting to adapt to media thickness variations.

In a further aspect of the invention, each of the separate loop or hook-like members 160 essentially form a nip-like area with backing member 152b when media 1000 passes therebetween. As noted above, micro-members 160 can be plastic. However, the present invention is not limited thereto. It is noted that micro-members 160 can be made of a fiber material or synthetic material. Further, rather than hooks and loops, the outer surface of roller 152a can be a coated cloth. Essentially, outer surface of roller 152a should preferably define a compliant surface which can be non-uniform.

In a feature of the present invention, spinning roller 152a with micro-members 160 thereon is sufficient to restrict the processing development to the image forming layer of media 1000, while leaving both the top most clear gel comprising layer intact and without scratches. Further, roller 152a with micromembers 160 thereon does not invade the bottom-most backing layer of media 1000 and thus, avoids pattern readout of low-cost media supports.

In the embodiment of FIG. 2, roller 152a has a width which matches the width of media 1000 and therefore, is effective to crush all the unhardened microcapsules and release imaging material to form an image. The imaging material that is released from the microcapsules comprises a coloring material which is used to form the image or material for black and white media. After formation of the image, the photosensitive media is conveyed pass heater 290 for fixing the image on the media. In a through-feed unit, the photosensitive media could thereafter be withdrawn through an exit 320. As a further option, image-forming device 150 can be a return unit in which the photosensitive media is conveyed to or returned back to opening 170.

Figure 3:
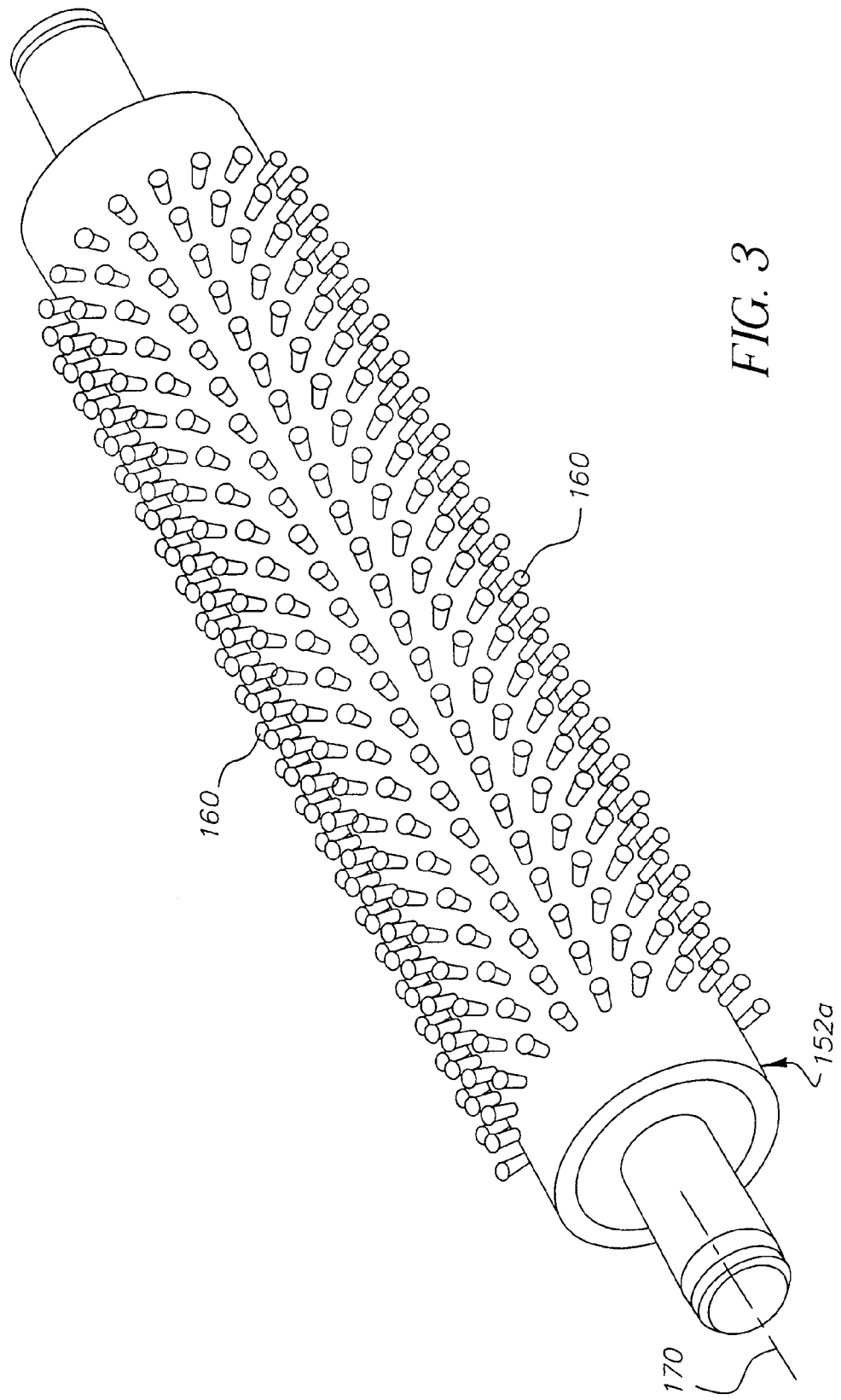
FIG. 3 shows a processing roller of the image-forming device of FIG. 2.

FIG. 3 is a more detailed view of roller 152a and micro-members 160 on roller 152a. As shown, roller 152a can be a tubular member that has an outer surface with plurality of micro-members 160 thereon. In the embodiment of FIG. 3 micro-members 160 are hook-like or loop-like members, which can be made of a plastic or resilient material. Additionally, as further described above, micromembers 160 can be provided on the outer surface of roller member 152a in a random or predetermined pattern with respect to location and height. The multiple loop or hook-like members 160 on roller member 152a essentially define an outer compliant surface for roller 152a, which compensates for any non-uniform surfaces of the media. In essence, roller 152a is self-correcting for media thickness variations and each of the hook or loop-like members 160 define a nip-like area with the opposing surface of backing member 152b that permits the passage of media therebetween while at the same time developing the image on the media. Further, any dust, dirt or debris which enters into a vicinity of roller 152a will not get caught onto the outer surface of roller 152a, since the outer surface of roller 152a comprises the multiple loop or hook-like members 160 which will not trap the dust or debris therein. Further, the spinning motion of hook or loop-like members 160 will tend to clear away any dust or dirt within the vicinity of roller 152a.

Figure 4:
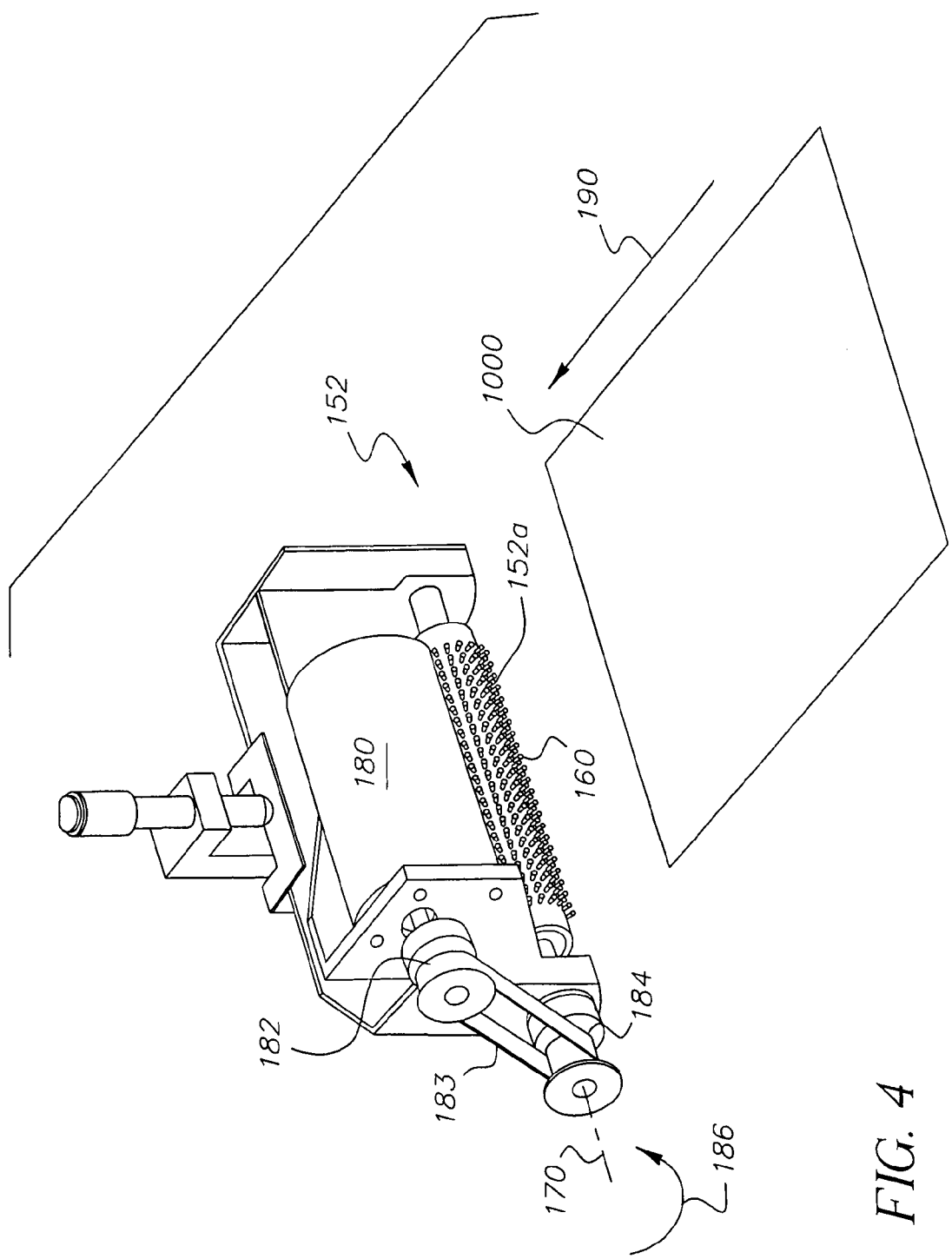
FIG. 4 is a perspective view of an image-forming device of the present invention.

FIG. 4 is a perspective view of development member 152 of imaging device 150 of the present invention. As illustrated and described, development member 152 includes roller 152a having loop or hook-like members 160 thereon. A first example for rotating roller 152a to achieve development of the latent image on media 1000 is through the use of a motor 180, which drives a shaft 182, which accordingly drives a drive belt 183. Drive belt 183 is drivingly associated with a shaft 184 of roller 152a. In the example of FIG. 4, rotational motion of motor 180 in a first direction will cause a subsequent rotation or spinning of roller 152a in direction 186 around center axis 170. In the example of FIG. 4, media 1000 approaches development member 152 in direction 190 and passes between roller 152a and backing member 152b illustrated in FIG. 2. The rotational force of roller 152a causes loop or hook-like members 160 to contact the top surface of media 1000 with a spinning or shearing motion that essentially is converted to a pressure on media 1000 to cause a rupture of the non-hardened microcapsules to release coloring material. This rotating motion, however, will not cause a scratching of the surface of media 1000. In a preferred embodiment, in order to assure development of the image, the media moves at a line velocity which is different from the spinning velocity of roller 152a to ensure a shearing action. Also, roller 152a can spin or rotate at various velocities in accordance with design considerations, however, faster velocities provide for a higher probability of more micro-members 160 striking the microcapsules on the media, which improves development.

Further, although roller 152a is shown as spinning in a direction opposite to the direction of movement of media 1000, the present invention is not limited thereto. Roller 152a can also spin in the direction of movement of media 1000 or tangentially to the direction of movement of media 1000.

Figure 5:
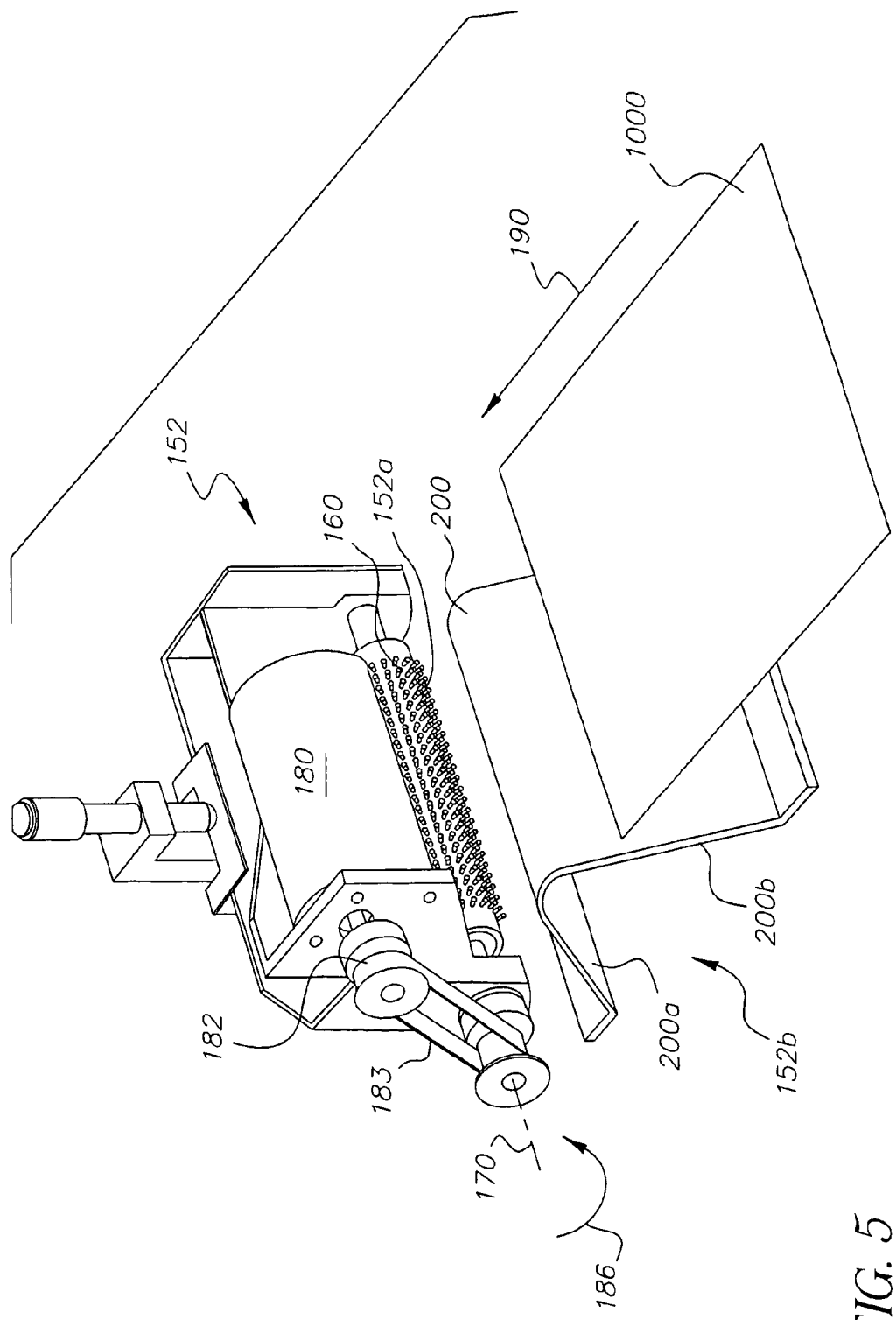
FIG. 5 is a perspective view of the image-forming device of FIG. 4, illustrating a backing member.

FIG. 5 is a perspective view of an embodiment of imaging device 150 and specifically, an embodiment illustrating roller 152a and backing member 152b of processing member 152. In the embodiment of FIG. 5, backing member 152b preferably comprises a surface 200 which opposes roller 152. Surface 200 is supported by opposing legs 200a, 200b. In this manner, when hook or loop-like members 160 of spinning roller 152a contact media 1000 passing between roller 152a and surface 200, the compliant character of roller 152a will compensate for any non-uniformities in media 1000. The spinning or rotating motion of roller 152a and the contacting of loop or hook-like members 160 onto the surface of media 1000 develop the image on media 1000. Further, in the embodiment of FIG. 5 surface 200 can be provided on flexible legs 200a, 200b to further add to the flexible nature of the arrangement. Also, as previously discussed, backing member 152b can alternatively be a roller that opposes roller 152a.

Figure 6:
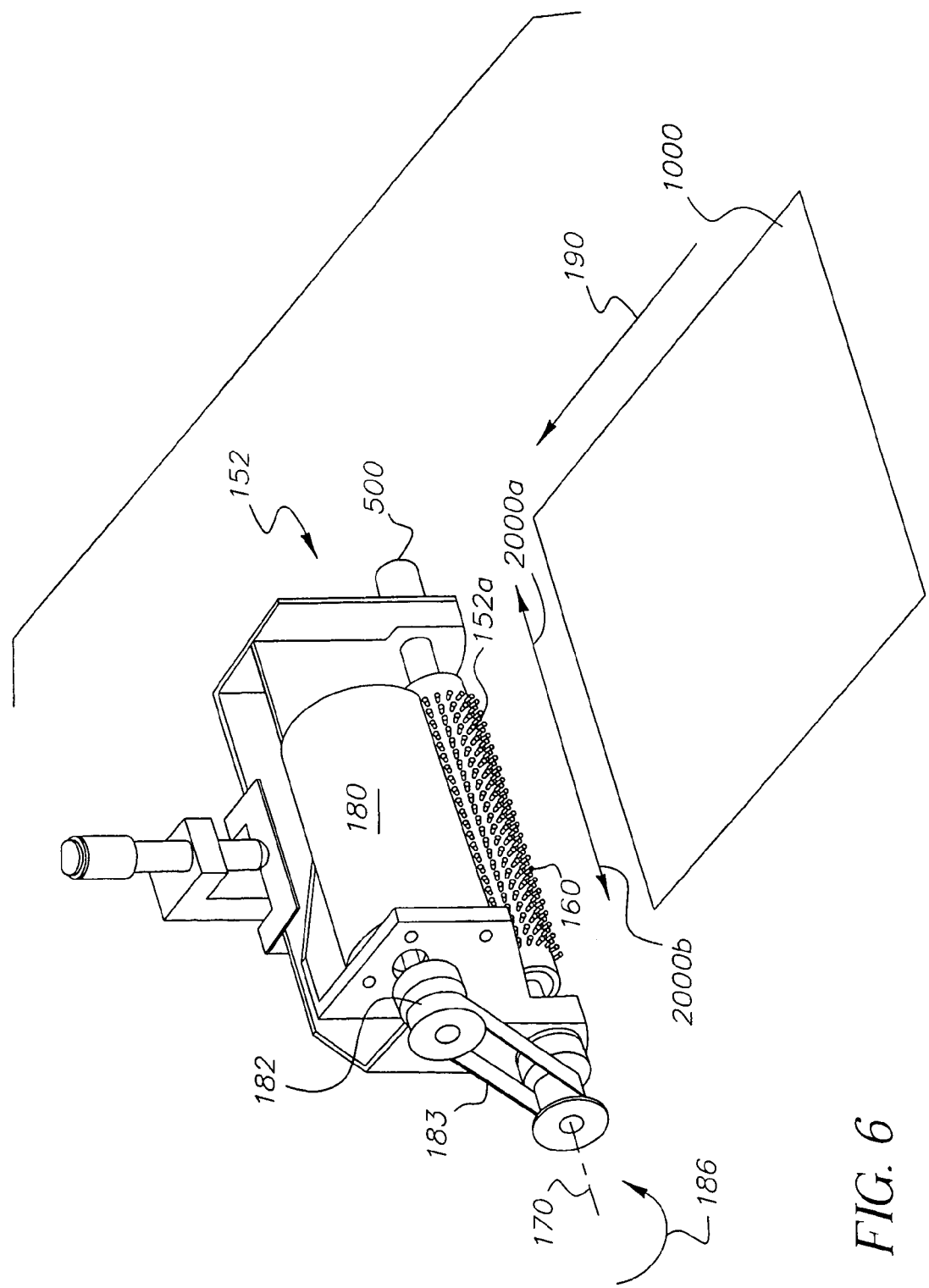
FIG. 6 is a further embodiment of an image-forming device in accordance with the present invention.

FIG. 6 illustrates a further embodiment of imaging device 150 of the present invention. In the embodiment of FIG. 6, in addition to spinning or rotating roller 152a about axis 170, roller 152a can be moved or reciprocated transversely in directions 2000a, 2000b which are perpendicular to the direction of movement 190 of media 1000. The embodiment of FIG. 6 enhances the contacting of hook or loop-like members 160 on the surface media 1000 by both spinning and reciprocating roller 152a to insure a complete development of the image on media 1000. In the embodiment of FIG. 6, linear or reciprocating motion of roller 152a could be achieved by a moving member, moving device or motor 500 attached to, for example, a pneumatic member, which is adapted to linearly move and reciprocate roller 152a. As a further option, roller 152a could be associated with a rack gear that would be drivingly connected to motor 180 or motor 500 through, for example, a gear train to cause the linear and reciprocating movement.

Figure 7:
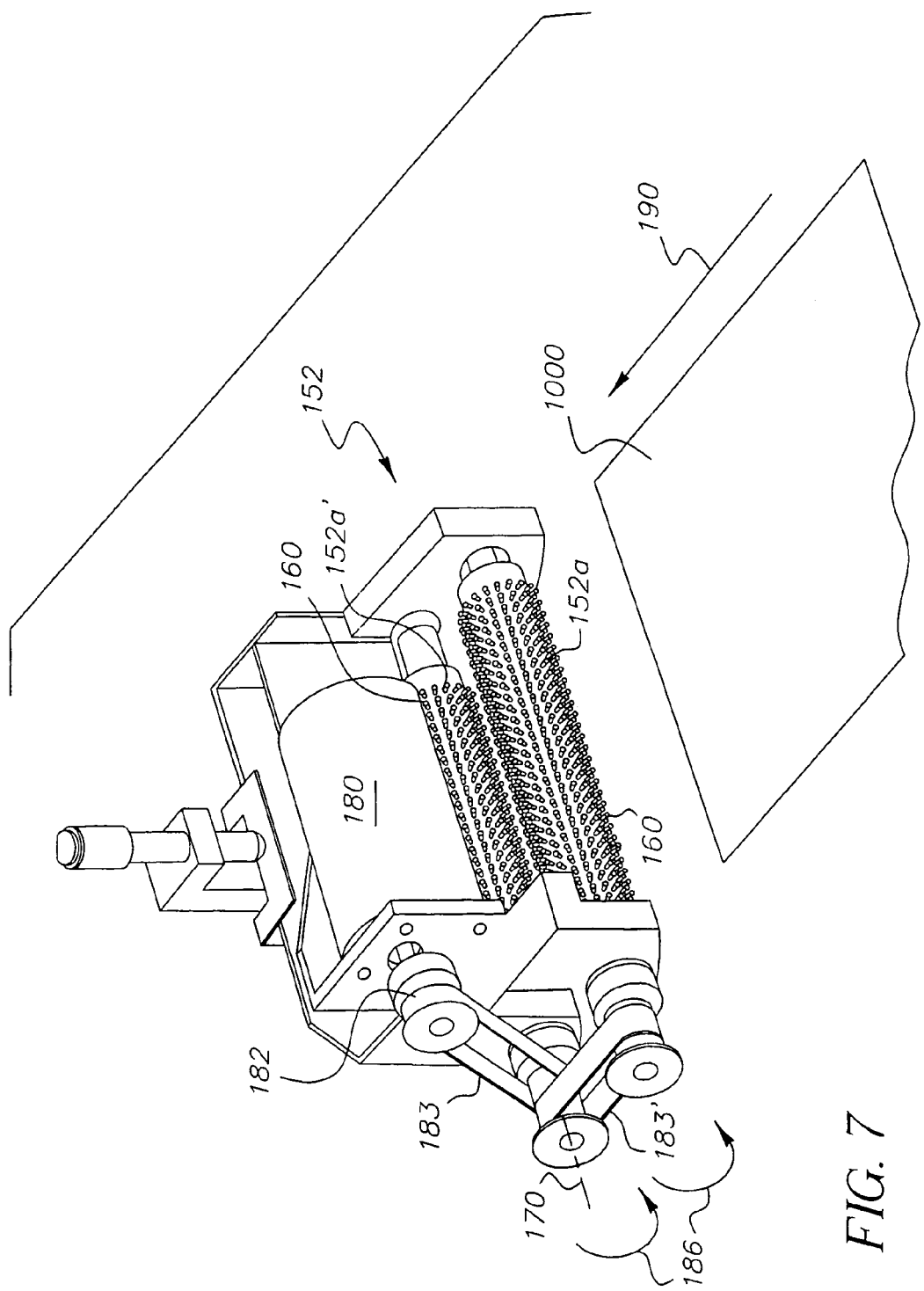
FIG. 7 is a further embodiment of an image-forming device in accordance with the present invention.

The embodiment of FIG. 7 is designed to maximize the locational density of the loop or hook-like members of the roller of developing member 152. More specifically, in the embodiment of FIG. 7, roller 152a as well as an additional roller 152a' slightly offset from roller 152a is shown. Each of rollers 152a and 152a' have hook or loop-like members 160 on an outer surface thereof. This arrangement maximizes the amount of hooks or loops that contact media 1000 as media 1000 passes below rollers 152a, 152a'. In the embodiment of FIG. 7, both rollers 152a, 152a' rotate or spin in direction 186 as shown, wherein the rotation can be enabled through the use of conveyer belts 183, 183' or a gear train to drive both rollers 152a, 152a'.

Figure 8:
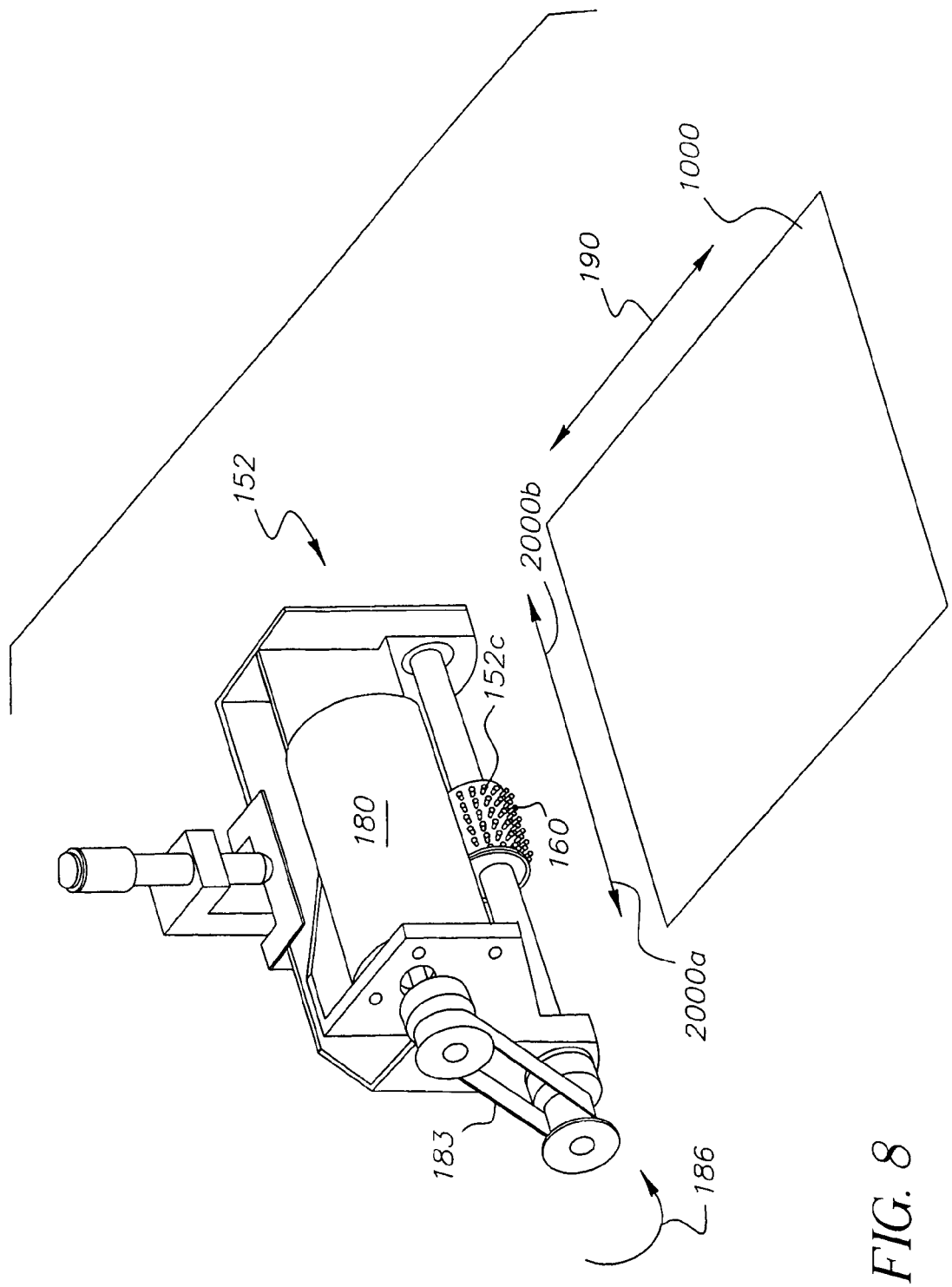
FIG. 8 is a further embodiment of an image-forming device in accordance with the present invention.

In the previous embodiments, the size of rollers 152a, 152a' basically matched the width of the media. In a further embodiment, the roller can be a small size roller 152c as shown in FIG. 8. Small size roller 152c can be adapted to move or reciprocate transversely in the directions 2000a, 2000b perpendicular to direction of movement 190 of media 1000. This linear movement can be caused by any type of linear movement mechanism or arrangement as previously described, such as a pneumatic cylinder, a gear arrangement, a rack gear, a helical gear, etc. Small size roller 152c is the same as roller 152a with respect to having an outer surface with micromembers such as loop or hook-like members as shown.

Figure 9:
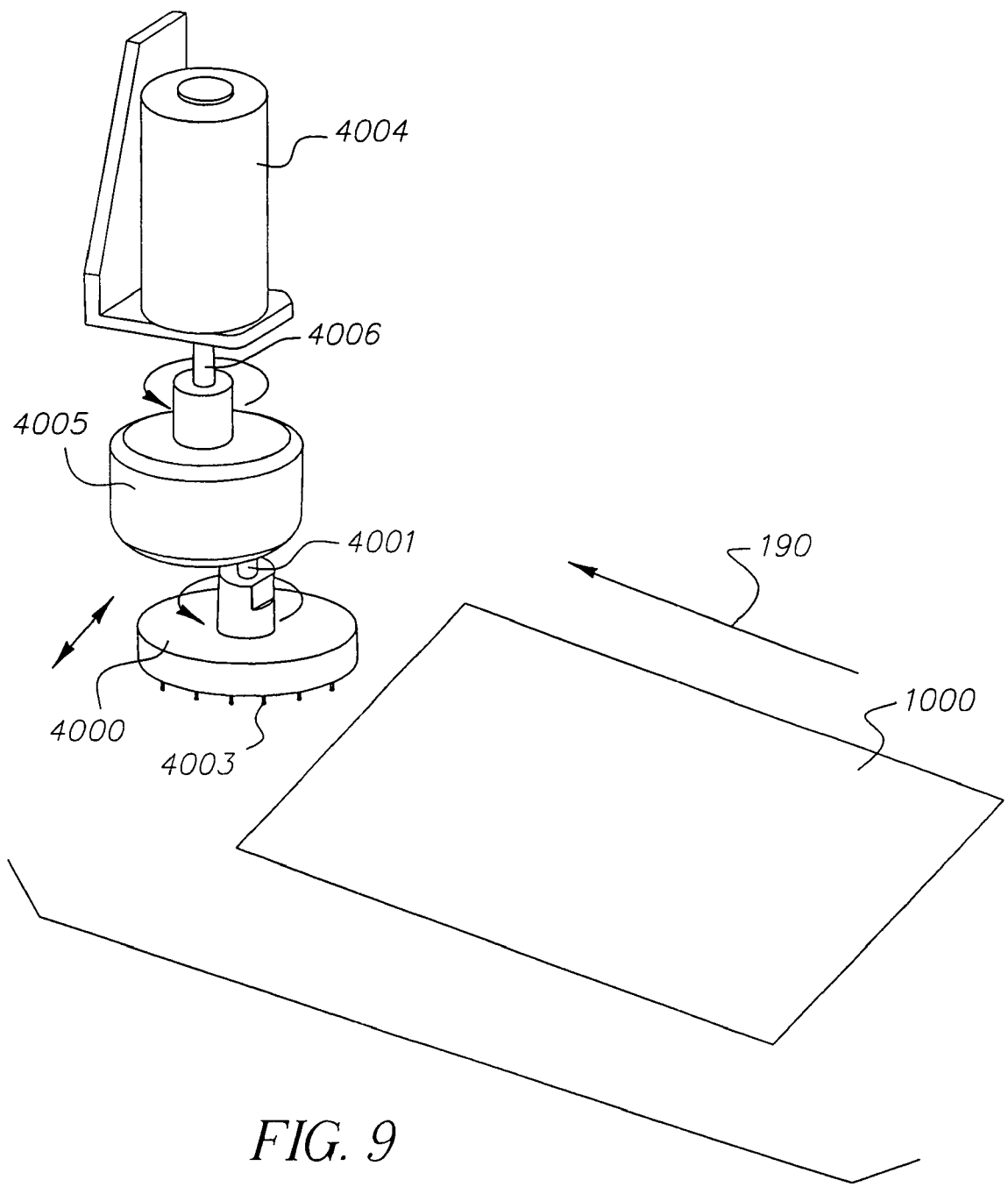
FIG. 9 is a further embodiment of an image-forming device in accordance with the present invention.

FIG. 9 illustrates a further embodiment of a development member in accordance with the present invention. In the previous embodiments, the rollers rotated about a horizontal axis 170, which is perpendicular to the direction of movement of the media. In the embodiment of FIG. 9, the development or processing member is in the form of a plate-like member 4000, which rotates or spins about a vertical axis 4001, which is perpendicular to direction of movement 190' of media 1000 as shown. In the embodiment of FIG. 9, plate-like member 4000 includes protruding micro-members 4003, which can be plastic or resilient hook or loop-like members that extend from the bottom surface of member 4000. Also shown is a motor 4004, which is adapted to rotate an eccentric-like intermediate member 4005, which is adapted to move plate member 4000 and shaft 4001 about a further axis 4006, and is further adapted to rotate plate member 4000 about axis 4001. Therefore, with the embodiment of FIG. 9, media 1000 can move below member 4000 as member 4000 is rotated and transversely moved. That is, member 4000 can both spin about center axis 4001 and also moves transversely about second axis offset from axis 4001. This assures a complete processing of the microcapsules as micro-member 4003 contacts the surface of media 1000.

Accordingly, the above embodiments provide for an improved imaging device wherein a processing roller or member in the form of, for example, a brush roller is rotated or spun and brought into contact with the top surface of micro-encapsulated media. The roller includes micromembers such as loop or hook-like member, which come into contact with the media and convert the rotational or spinning motion into a pressure that is sufficient to rupture the microcapsules. The brush roller of the present invention achieves a Dmax (maximum density), which is improved over the Dmax of, for example, a conventional ball-like pressure-type roller.

The arrangement of the present invention is advantageous for processing media such as disclosed in co-pending application U.S. Ser. No. 10/687,939, since the plastic or resilient loop or hook-like member provide a sufficient force to rupture the capsules, while the random position and height of the loop or hook-like members allow for uniform development of non-uniform media thickness. Further, the roller is self-correcting due to a compliant surface. With the arrangement of the present invention, there is no need for a high spring force or a large roller with high hardness.

The present invention also permits the use of a low cost base media since the processing is restricted to the microcapsules and any deformation or patterning caused by density differences in the support sheet and read out in the development of the media due to the resulting differential pressures is of no consequence. Further, the roller is self-cleaning since debris cannot damage the loop or hook-like members, and the roller effectively removes the debris from the print surface during processing.

The invention has been described in detail with particular reference to certain preferred embodiments thereof, but it will be understood that variations and modifications can be effected within the spirit and scope of the invention.

What is claimed is:

1. An image forming device comprising:
    an imaging member adapted to expose a photosensitive medium to form a latent image on the photosensitive medium, the photosensitive medium comprising a plurality of microcapsules which encapsulate imaging material; and
    a rotatable processing member adapted to develop the latent image, said processing member comprising a compliant surface that includes micro-members which contact the photosensitive medium during a rotation of the processing member to apply a force to a surface of the photosensitive medium, said force being sufficient to release imaging material from said microcapsules, wherein said micro-members are a plurality of hook or loop like members which extend from an outer surface of said processing member.

2. An image forming device according to claim 1, further comprising a motor which is adapted to rotate said processing member about an axis which is transverse to a direction of movement of the medium.

3. An image forming device according to claim 2, further comprising a movement device adapted to reciprocate said processing member in a linear direction along said axis and transverse to the direction of movement of the medium.

4. An image-forming device according to claim 3, wherein said processing member has a width which is smaller than a width of said medium.

5. An image forming device comprising:
    an imaging member adapted to expose a photosensitive medium to form a latent image on the photosensitive medium, the photosensitive medium comprising a plurality of microcapsules which encapsulate imaging material; and
    a rotatable processing member adapted to develop the latent image, said processing member comprising a compliant surface that includes micro-members which contact the photosensitive medium during a rotation of the processing member to apply a force to a surface of the photosensitive medium, said force being sufficient to release imaging material from said microcapsules, wherein said processing member is a tubular member which extends in a width-wise direction transverse to a direction of movement of the medium, and said micro-members are a plurality of hook or loop like members which extend from an outer surface of tubular member.

6. An image forming device comprising:
    an imaging member adapted to expose a photosensitive medium to form a latent image on the photosensitive medium, the photosensitive medium comprising a plurality of microcapsules which encapsulate imaging material;
    a rotatable processing member adapted to develop the latent image, said processing member comprising a compliant surface that includes micro-members which contact the photosensitive medium during a rotation of the processing member to apply a force to a surface of the photosensitive medium, said force being sufficient to release imaging material from said microcapsules; and
    a second rotatable processing member located downstream of said processing member with respect to a direction of movement of the medium, said second processing member being off-set from said processing member, said second processing member comprising a second non-uniform compliant surface including micro-members which contact the photosensitive medium during a rotation of the second processing member, to apply a further force to the surface of the photosensitive medium, said further force being sufficient to release imaging material from said microcapsules.

7. An image forming device according to claim 6, further comprising a backing member positioned so as oppose said processing member, wherein said medium passes between said processing member and said backing member.

8. An image-forming device according to claim 7, wherein said backing member is an opposing roller.

9. An image-forming device according to claim 7, wherein said backing member is an opposing surface.

10. An image forming device comprising:
an imaging member adapted to expose a photosensitive medium to form a latent image on the photosensitive medium, the photosensitive medium comprising a plurality of microcapsules which encapsulate imaging material; and
a rotatable processing member adapted to develop the latent image, said processing member comprising a compliant surface that includes micro-members which contact the photosensitive medium during a rotation of the processing member to apply a force to a surface of the photosensitive medium, said force being sufficient to release imaging material from said microcapsules, wherein said rotatable processing member is a plate-like member which is adapted to be rotated about a vertical axis.

11. An image forming method comprising:
exposing a photosensitive medium comprising a plurality of micro-capsules which encapsulate imaging material to form a latent image; and
developing the latent image by contacting a surface of said medium with a spinning processing member have a compliant surface formed by micro-members, said contacting of the spinning micro-members with the surface of the medium applying a force to the surface of the medium which is sufficient to release imaging material from the microcapsules, wherein said micro-members comprise a plurality of hook or loop-like members located on a surface of said processing member.

12. An image forming method according to claim 11, wherein during said developing step, the medium is conveyed between the spinning processing member and a backing member.

13. An image forming method according to claim 11, wherein said developing step further comprises reciprocating said spinning processing member in a linear direction which is transverse to a direction of movement of the medium.

14. An image forming method comprising:
exposing a photosensitive medium comprising a plurality of micro-capsules which encapsulate imaging material to form a latent image; and
developing the latent image by contacting a surface of said medium with a spinning processing member have a compliant surface formed by micro-members, said contacting of the spinning micro-members with the surface of the medium applying a force to the surface of the medium which is sufficient to release imaging material from the microcapsules, wherein said developing step comprises contacting two of said spinning processing members to said medium, said processing members being positioned offset with respect to each other.

* * * * *